(12) United States Patent
Takeda et al.

(10) Patent No.: US 7,901,123 B2
(45) Date of Patent: Mar. 8, 2011

(54) LIGHT EMITTING MODULE AND VEHICLE LAMP

(75) Inventors: Hitoshi Takeda, Shizuoka (JP); Tsukasa Tokida, Shizuoka (JP); Hiroyuki Ishida, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 727 days.

(21) Appl. No.: 11/805,193

(22) Filed: May 22, 2007

(65) Prior Publication Data

US 2007/0274086 A1 Nov. 29, 2007

(30) Foreign Application Priority Data

May 29, 2006 (JP) ................................ 2006-147664

(51) Int. Cl.
*F21V 7/04* (2006.01)

(52) U.S. Cl. ......... 362/549; 362/538; 362/543; 362/545; 257/99; 257/E33.062; 257/E33.066; 257/690

(58) Field of Classification Search .................. 362/538, 362/543, 545, 549, 800; 257/99, E33.062, 257/E33.066, 690
See application file for complete search history.

(56) References Cited

U.S. PATENT DOCUMENTS

| | | | |
|---|---|---|---|
| 6,355,946 B1 * | 3/2002 | Ishinaga | 257/98 |
| 7,284,882 B2 * | 10/2007 | Burkholder | 362/294 |
| 7,384,176 B2 * | 6/2008 | Ishida | 362/545 |
| 2004/0233678 A1 * | 11/2004 | Ishida et al. | 362/539 |
| 2005/0146870 A1 * | 7/2005 | Wu | 362/227 |
| 2005/0180157 A1 * | 8/2005 | Watanabe et al. | 362/543 |

FOREIGN PATENT DOCUMENTS

| | | |
|---|---|---|
| DE | 10 2005 003 213 A1 | 8/2005 |
| JP | 2005-32661 | 2/2005 |

OTHER PUBLICATIONS

Office Action with English Translation from the German Patent Office dated Mar. 31, 2008; Official File No. 10 2007 024 922.7-54 (6 pages).

* cited by examiner

*Primary Examiner* — Sandra L O Shea
*Assistant Examiner* — Mary Zettl
(74) *Attorney, Agent, or Firm* — Osha Liang LLP

(57) ABSTRACT

A light emitting module includes a semiconductor light emitting element disposed on a rectangular board, and a pair of plane-shaped electrode portions formed on the board and coupled to the semiconductor light emitting element. The pair of plane-shaped electrode portions is separated in first opposite directions, and a center of the semiconductor light emitting element is shifted from a center of the board in one of second opposite directions. End faces of the pair of plane-shaped electrode portions do not protrude in the one of the second opposite directions from an end face of the semiconductor light emitting element on a side facing toward the one of the second opposite directions. The first opposite directions are directions along which one pair of opposite sides of the board extend, and the second opposite directions are directions along which the other pair of opposite sides of the board extend.

19 Claims, 8 Drawing Sheets

LIGHT EMITTING MODULE AND VEHICLE LAMP

CROSS-REFERENCE TO RELATED APPLICATIONS

The present invention claims priority from Japanese Patent Application No. 2006-147664 filed on May 29, 2006, the entire content of which is incorporated herein by reference.

BACKGROUND OF INVENTION

1. Field of the Invention

The present invention relates to a light emitting module and a vehicle lamp. More specifically, the present invention relates to a technique for preventing generation of glare light.

2. Description of the Related Art

Some light emitting modules employ a semiconductor light emitting element such as a light emitting diode (LED) as a light source (see, e.g., JP-A-2005-032661). Such a light emitting module is provided, for example, in a vehicle lamp in which a light emitted from a light source is irradiated as irradiation light via a projection lens.

Such a light emitting module includes a semiconductor light emitting element disposed on a board, and a pair of positive and negative plane-shaped electrode portions coupled to the semiconductor light emitting element via a conductive pattern, whereby the semiconductor light emitting element is supplied with electric power via the plane-shaped electrode portions and the conductive pattern to emit light.

However, a part of the light emitted from the semiconductor light emitting element is reflected by the plane-shaped electrode portions, and the light thus reflected is irradiated via the projection lens.

The light reflected by the plane-shaped electrode portions and irradiated via the projection lens is projected above a cutoff line of an irradiation pattern of the irradiation light. Thus, glare light is generated.

SUMMARY OF INVENTION

One or more embodiments of the present invention provide a light emitting module and a vehicle lamp in which glare light is prevented from being generated.

According to one aspect of the invention, a light emitting module for a vehicle lamp includes: a board formed in a rectangular shape; a conductive pattern formed on the board; a light emitting portion disposed on the board, the light emitting portion including a semiconductor light emitting element; and a pair of plane-shaped electrode portions formed on the board and coupled to the semiconductor light emitting element via the conductive pattern. When directions along which one pair of opposite sides of the board extend are defined as first opposite directions, and directions along which the other pair of opposite sides of the board extend are defined as second opposite directions, both the first opposite directions and the second opposite directions are orthogonal to a thickness direction of the board, the pair of plane-shaped electrode portions are located so as to be separated in the first opposite directions, a center of the semiconductor light emitting element is located at a position shifted from a center of the board in one of the second opposite directions, and end faces of the pair of plane-shaped electrode portions on a side facing toward the one of the second opposite directions are arranged so as not to protrude in the one of the second opposite directions from an end face of the semiconductor light emitting element on the side facing toward the one of the second opposite directions.

According to another aspect of the invention, a vehicle lamp includes: a light emitting module; and a projection lens through which light emitted from the light emitting module is irradiated as irradiation light. The light emitting module includes: a board formed in a rectangular shape; a conductive pattern formed on the board; a light emitting portion disposed on the board, the light emitting portion including a semiconductor light emitting element; and a pair of plane-shaped electrode portions formed on the board and coupled to the semiconductor light emitting element via the conductive pattern. When directions along which one pair of opposite sides of the board extend are defined as first opposite directions, and directions along which the other pair of opposite sides of the board extend are defined as second opposite directions, both the first opposite directions and the second opposite directions are orthogonal to a thickness direction of the board, the pair of plane-shaped electrode portions are located so as to be separated in the first opposite directions, a center of the semiconductor light emitting element is located at a position shifted from a center of the board in one of the second opposite directions, and end faces of the pair of plane-shaped electrode portions on a side facing toward the one of the second opposite directions are arranged so as not to protrude in the one of the second opposite directions from an end face of the semiconductor light emitting element on the side facing toward the one of the second opposite directions.

Other aspects and advantages of the invention will be apparent from the following description and the appended claims.

DETAILED DESCRIPTION

Hereinafter, embodiments of a light emitting module and a vehicle lamp according to the invention will be described with reference to the accompanying drawings.

Figure 1:
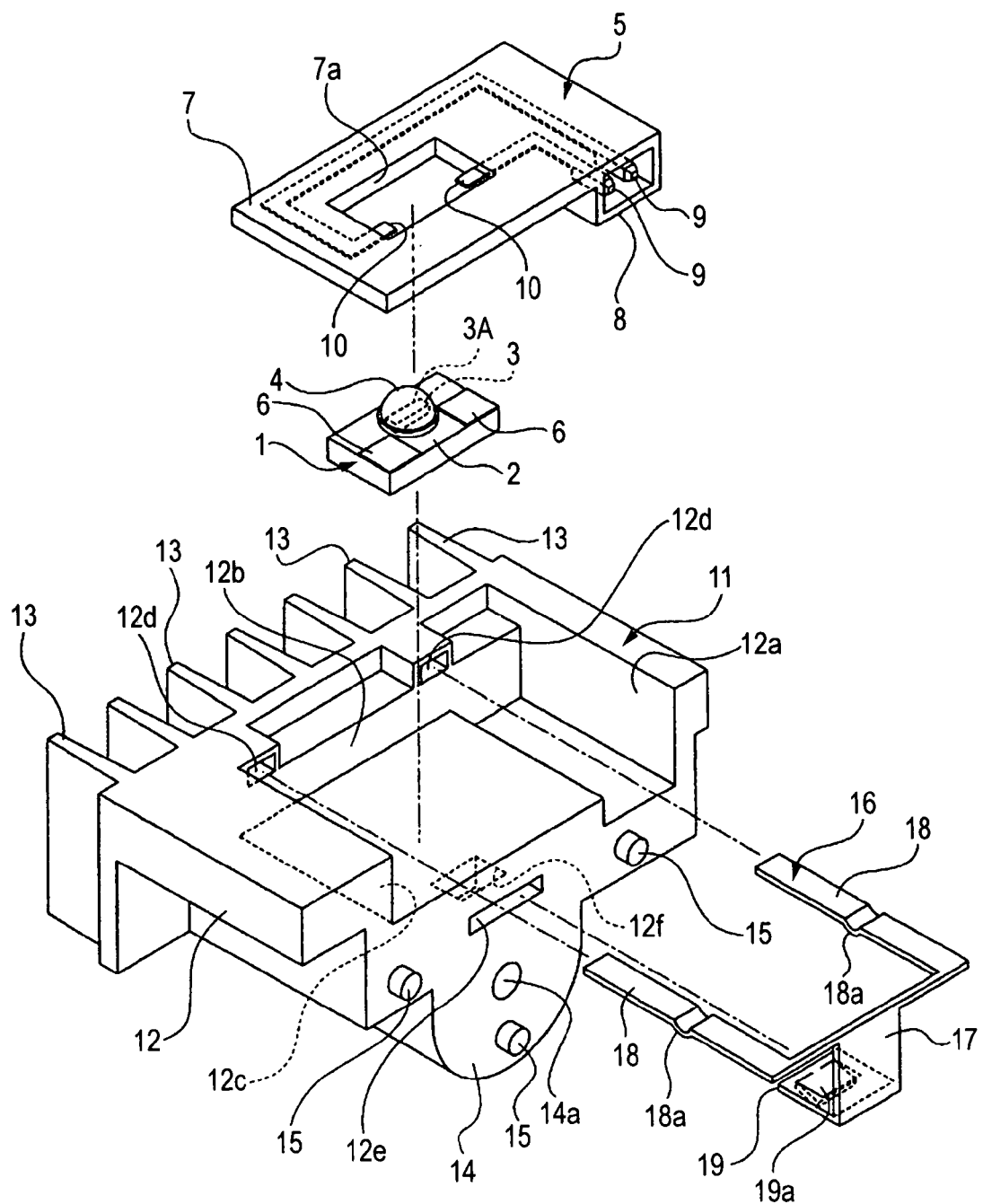
FIG. 1 is an exploded perspective view showing a light emitting module, a radiation body and a clip according to an embodiment of the invention.

A light emitting module 1 includes a board 2, a semiconductor light emitting element 3, such as a light emitting diode (LED) chip, and a cover 4 are coupled to a feeding attachment 5 (see FIG. 1).

The board 2 is formed in a rectangular shape, for example, an elongated rectangular shape. The board 2 may be an aluminum nitride board, an alumina board, a mullite board, or a glass ceramics board. A pair of conductive patterns 2a, 2a are formed on the board 2 (see FIG. 2).

Plane-shaped electrode portions 6, 6 are joined to end portions located at the outer sides of the conductive patterns 2a, 2a of the board 2, respectively. Supposing that two opposite directions each orthogonal to the thickness direction of the board 2 and to which two pairs of the opposed side edges of the board respectively extend are called first opposite directions (a longitudinal direction) and second opposite directions (a direction orthogonal to the longitudinal direction), respectively (see FIG. 2), the plane-shaped electrode portions 6, 6 are located respectively at the both end portions of the board 2 in the first opposite directions and also located at the one end portion of the board 2 in the second opposite directions.

Because the plane-shaped electrode portions 6, 6 are fixed to feeding terminals 10, 10 of the feeding attachment 5 by means of welding, a metal pad formed by a metal material suitable for the welding is used as each of the plane-shaped electrode portions. Further, because the plane-shaped electrode portions 6, 6 are joined to the board 2, the plane-shaped electrode portions are formed by material having a linear expansion coefficient close to that of the board 2. Thus, the portions 2, 2 are formed by a nickel-iron alloy, a nickel-cobalt alloy, etc.

Each of the plane-shaped electrode portions 6, 6 may be subjected to the surface processing by nickel or tin, for example, in order to prevent the plane-shaped electrode portions from being corroded.

The plane-shaped electrode portions 6, 6 are joined to the conductive patterns 2a, 2a by predetermined joining material. As the joining material, material with an excellent heat resistance property is used in order to improve the reliability of the welding between the plane-shaped electrode portions 6, 6 and the feeding terminals 10, 10 of the feeding attachment 5. Thus, as the joining material, silver solder such as silver-copper, silver-copper-titan, silver-copper-tin, silver-copper-indium, or solder such as gold-tin is used.

As the semiconductor light emitting element 3, for example, a light emitting diode is used on which fluorescent material is coated uniformly in a film shape. The semiconductor light emitting element 3 is disposed on the board 2 in a state of extending over the conductive patterns 2a, 2a or is disposed on the board via a submount which extends over the conductive patterns 2a, 2a. When the semiconductor light emitting element 3 is not disposed on the submount, the semiconductor light emitting element 3 functions as a light emitting portion 3A by itself. When the semiconductor light emitting element 3 is disposed on the submount, the semiconductor light emitting element 3 functions as the light emitting portion 3A together with the submount.

Figure 2:
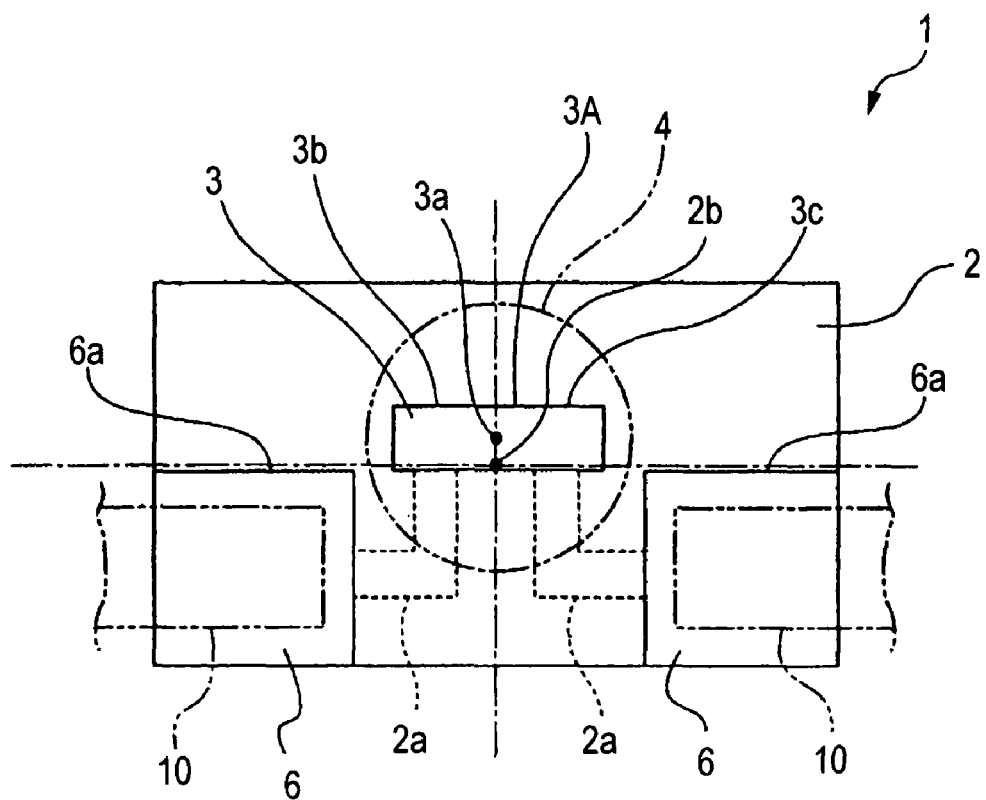
FIG. 2 is an enlarged plan view showing the positional relation between a semiconductor light emitting element and plane-shaped electrode portions.
Figure 2:
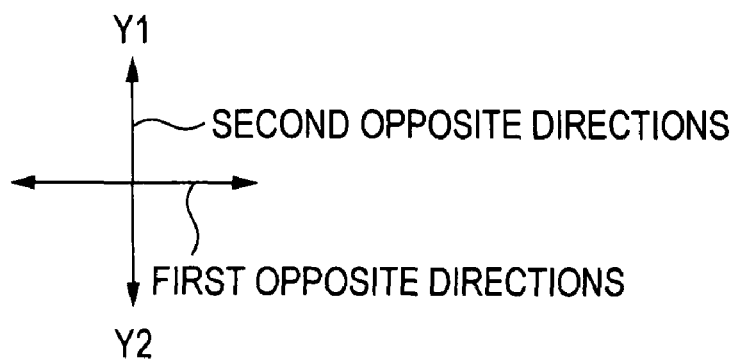

The light emitting portion 3A is configured in an elongated rectangular shape, for example, and disposed such that its longitudinal direction coincides with the longitudinal direction of the board 2 (see FIG. 2).

The semiconductor light emitting element 3 is disposed such that the center 3a thereof located at a position shifted in a direction Y1 (see FIG. 2) of the second opposite directions with respect to the center 2b of the board 2.

The end face 3b of the semiconductor light emitting element 3 facing the direction Y1 is located at the same position in the second opposite directions as the end faces 6a, 6a in the direction Y1 of the plane-shaped electrode portions 6, 6 or located at a position on a side toward the direction Y1 from the same position (see FIG. 2). Thus, the plane-shaped electrode portions 6, 6 do not protrude on the direction Y1 side than the semiconductor light emitting element 3.

A light emitted from the end edge 3c on the direction Y1 side of the semiconductor light emitting element 3 forms at least a part of the cutoff line of the irradiation pattern of an irradiation light as described later.

The cover 4 is formed in an almost hemispherical shape in its outer periphery and joined to the upper surface of the board 2 so as to cover the semiconductor light emitting element 3 (see FIG. 1). When the cover 4 is joined to the board 2, the semiconductor light emitting element 3 is disposed in a hollow hermetical area within the cover 4.

The feeding attachment 5 is formed in a manner that respective portions thereof except for a conductive portion are integrally formed of resin material. The feeding attachment includes a base plane portion 7 which has an almost flat plate shape and faces directed to the up-and-down directions, and a projection portion 8 protruded downward from the one end portion of the base plane portion 7.

A disposing hole 7a having an almost rectangular shape is formed at the base plane portion 7.

The projection portion 8 is provided with feeding portions 9, 9. The feeding portions 9, 9 are connector terminals to be coupled to an external power supply, respectively, for example.

The feeding attachment 5 is provided with feeding terminals 10, 10. Each of the feeding terminals 10, 10 is formed in a flat plate shape, for example. The feeding terminals are arranged in a manner that the one end portions thereof are protruded from the inner peripheral surface of the feeding attachment 5 so as to approach to each other and the other end portions thereof are coupled to the feeding portions 9, 9, respectively. The feeding terminals 10, 10 are integrally formed with the feeding portions 9, 9, the base plane portion 7 and the projection portion 8 by the insert molding.

The feeding terminals 10, 10 are integrally formed by the same material as the feeding portions 9, 9. The feeding terminals 10, 10 are fixed to the plane-shaped electrode portions 6, 6 by the laser welding, for example. Thus, each of the feeding terminals 10, 10 is formed by material with a high absorption factor of laser light, for example, phosphor bronze, brass, or iron, etc.

Figure 3:
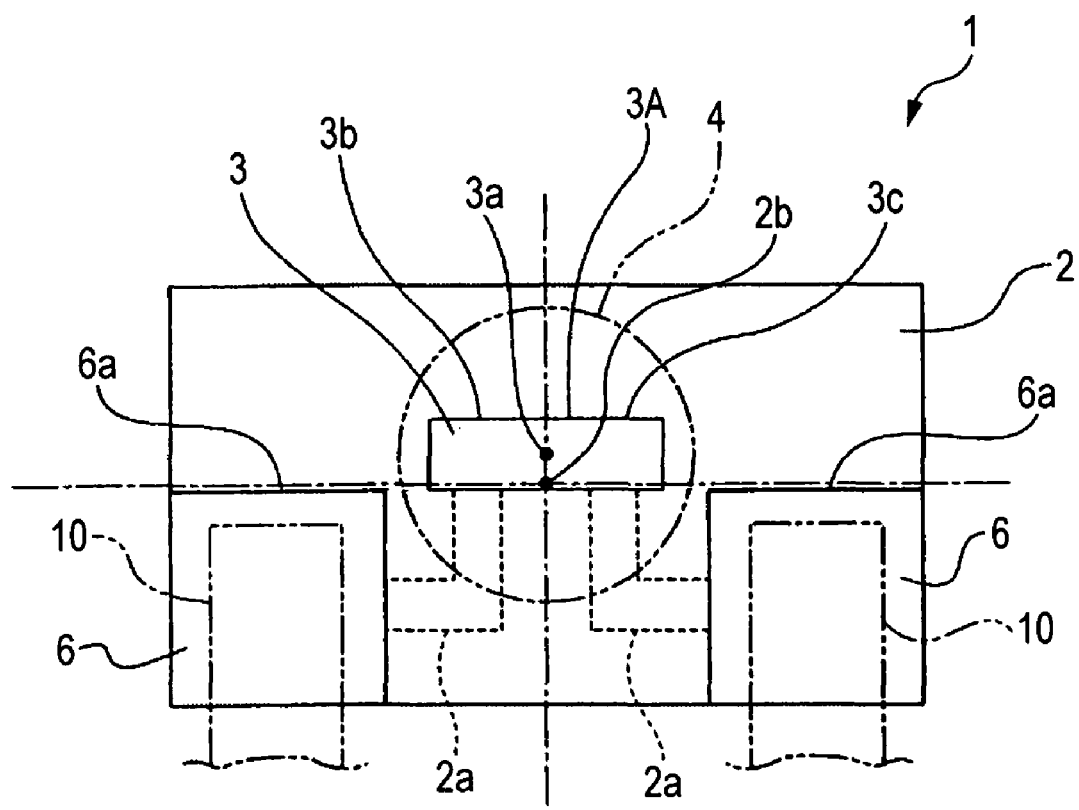
FIG. 3 is a plan view showing a state where feeding terminals are fixed to the plane-shaped electrode portions from another direction.

The feeding terminals 10, 10 of the feeding attachment 5 are respectively fixed to the plane-shaped electrode portions 6, 6 of the board 2 by the welding, for example, the laser welding or the resistance welding (see FIG. 2). In particular, when the feeding terminals 10, 10 are fixed to the plane-shaped electrode portions 6, 6 by the laser welding, the fixing procedure can be performed in a short time and so the manufacturing cost can be reduced As described above, because the plane-shaped electrode portions 6, 6 are formed at the end portion in the second opposite directions of the board 2, both the feeding terminals 10, 10 can be fixed to the plane-shaped electrode portions 6, 6 from the second opposite directions as shown in FIG. 3, respectively. When the plane-shaped electrode portions 6, 6 are formed at the end portion of the board 2 in this manner, the degree of freedom of design can be improved.

Because the feeding terminals 10, 10 are fixed to the plane-shaped electrode portions 6, 6, the semiconductor light emitting element 3 is electrically coupled to the feeding portions 9, 9 via the plane-shaped electrode portions 6, 6 and the feeding terminals 10, 10.

Figure 4:
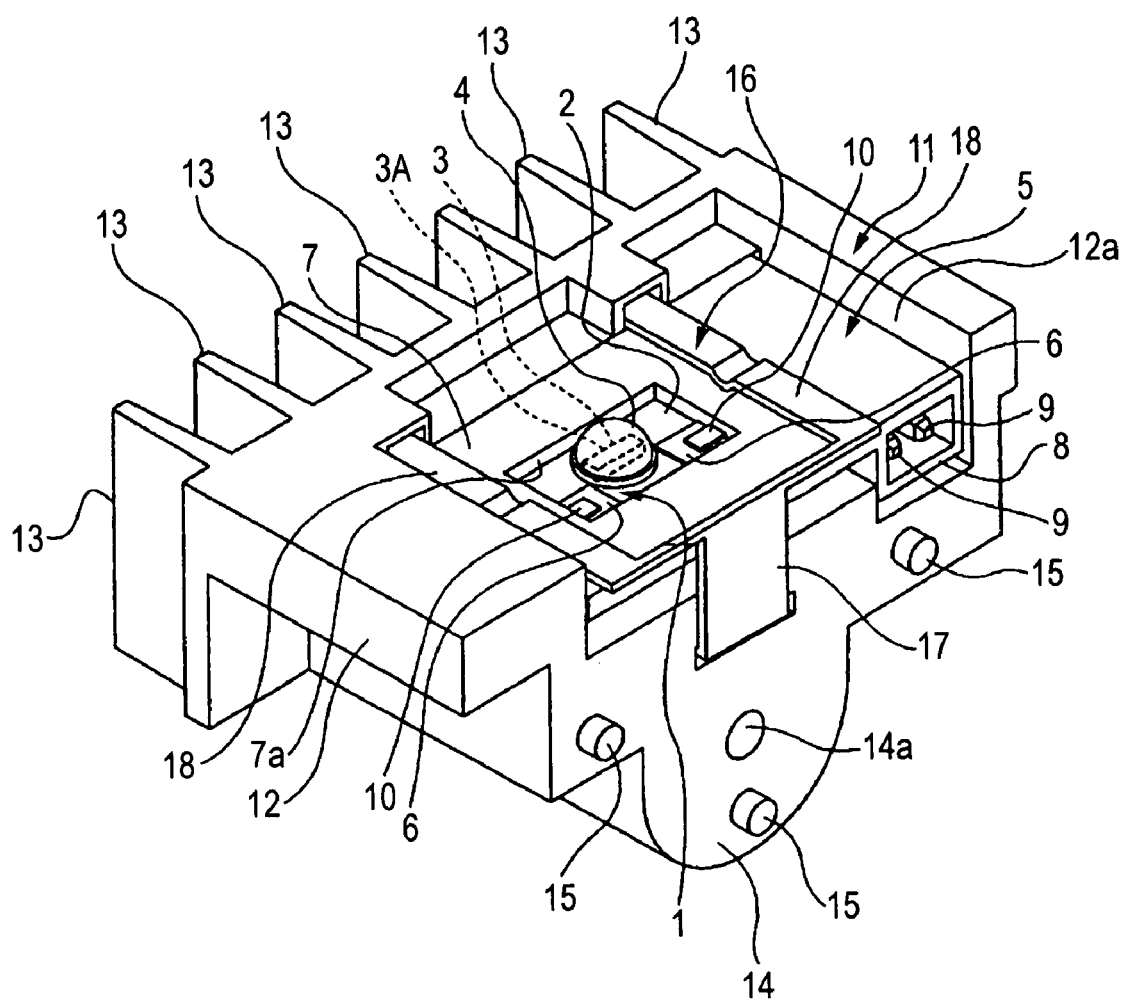
FIG. 4 is a perspective view showing a state where the light emitting module is fixed to the radiation body by the clip.

The feeding attachment 5, to which the light emitting module 1 thus configured is attached, is attached to a radiation body 11 (see FIGS. 1 and 4).

The respective portions of radiation body 11 are integrally formed by metal material, etc. with high heat transfer properties. As shown in FIG. 1, the radiation body is configured by a base portion 12, radiation fins 13, 13, . . . , 13 protruded backward from the base portion 12, and an attachment projection portion 14 protruded downward from the base portion 12.

The base portion 12 is provided with a disposing recess portion 12*a*, which is opened in the forward and upward directions. The surface directed to the forward direction and the surface directed to the right direction, each forming the disposing recess portion 12*a*, are formed as positioning surfaces 12*b*, 12*c*, respectively.

Insertion holes 12*d*, 12*d* are formed at the rear end portion of the base portion 12 so as to be separated from each other. An attaching insertion hole 12*e* is formed at the front surface of the base portion 12. An engagement hole 12*f* opened upward is formed at the inner portion of the attaching insertion hole 12*e*. Positioning projection portions 15, 15 each protruded in the forward direction are formed at the front surface of the base portion 12 so as to be separated from each other.

The radiation fins 13, 13, . . . , 13 are provided with a constant interval therebetween.

The attachment projection portion 14 is provided with positioning projection portions 15 protruded in the forward direction. A screw insertion hole 14*a* is formed at the attachment projection portion 14 so as to penetrate in the longitudinal direction.

The feeding attachment 5 is fixed to the radiation body 11 by a clip 16. The respective portions of the clip 16 are formed integrally by a plate-shaped metal material having elasticity (see FIG. 1). The clip 16 is configured by a coupling portion 17 directed in the longitudinal direction, pressing projection portions 18, 18 protruded backward from the upper edge of the coupling portion 17, and an insertion projection portion 19 protruded backward respectively from the lower edge of the coupling portion 17.

The potions 18, 18 are protruded backward from the opposite both end portions of the coupling portion 17, and each of the pressing projection portions 18, 18 has an engagement projection 18*a* protruded downward at the center portion thereof in the protruding direction. Each of the engagement projections 18*a* is formed so as to extend in the left and right directions.

A raised engagement projection piece 19*a* is formed at the insertion projection portion 19 in a manner that the engagement projection piece 19*a* is cut and raised so as to protrude obliquely downward in the forward direction.

The feeding attachment 5 is disposed within the disposing recess portion 12*a* of the radiation body 11 in a manner that the rear surface and the left side surface thereof are urged against the positioning surfaces 12*b*, 12*c*, respectively, thereby to position the feeding attachment with respect to the radiation body 11.

In a state where the positioning is performed in this manner, the pressing projection portions 18, 18 of the clip 16 are inserted from the forward direction into the insertion holes 12*d*, 12*d* of the radiation body 11 and the insertion projection portion 19 of the clip 16 is inserted from the forward direction into the attaching insertion hole 12*e* of the radiation body 11.

The feeding attachment 5 is pressed by the engagement projections 18*a* of the clip 16 and is fixed to the radiation body 11 when the engagement projection piece 19*a* of the clip 16 engages with the front side opening edge of the engagement hole 12*f* of the radiation body 11 (see FIG. 4).

In a state where the feeding attachment 5 is fixed to the radiation body 11, the connector of a not-shown power supply cord coupled to the external power supply is coupled to the feeding portions 9, 9 of the feeding attachment 5.

In a state where the feeding attachment 5 coupled to the light emitting module 1 is fixed to the radiation body 11 by the clip 16 as described above, the radiation body 11 is attached to an optical component having a reflector 20 and a not-shown projection lens. When the radiation body 11 is attached to the optical component and both the radiation body and the optical component are disposed within a lamp housing, a vehicle lamp 21 is completed (see FIGS. 5 and 6).

The radiation body 11 is positioned when the positioning projection portions 15, 15, 15 are abutted against the optical component and is attached to the optical component by a not-shown fastening screw inserted from the backward direction into the screw insertion hole 14*a*.

Figure 5:
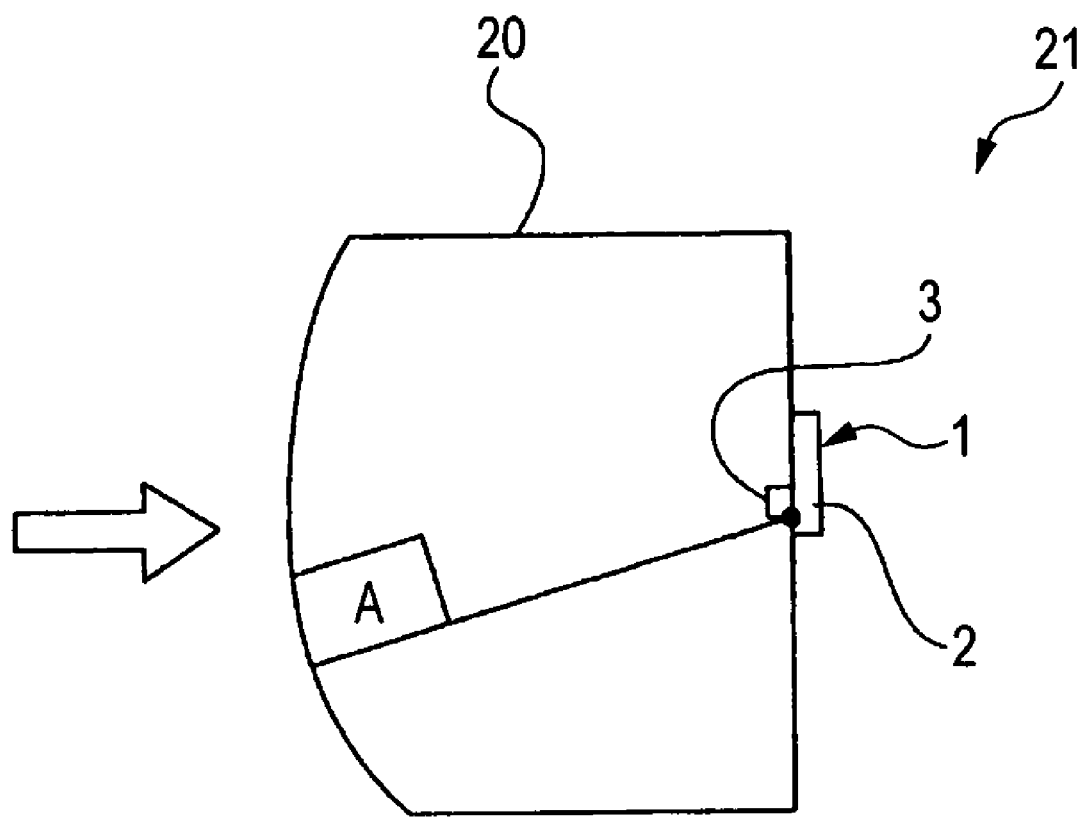
FIG. 5 is a conceptual view of a vehicle lamp which is seen from a front side, and shows a positional relation between a reflector, a board, and the semiconductor light emitting element.
Figure 6:
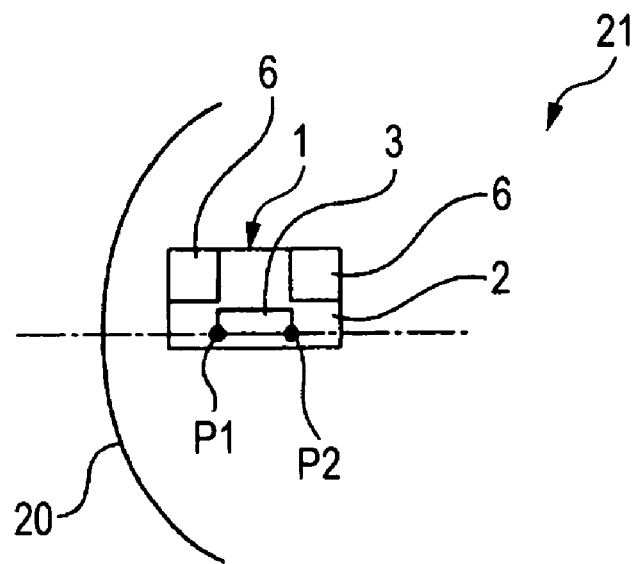
FIG. 6 is a conceptual view of the vehicle lamp is seen from an arrow direction in FIG. 5.

In a state where the radiation body 11 is attached to the optical component, the board 2 is placed in a state of being directed to the left and right directions and the semiconductor light emitting element 3 is directed to a direction that the end edge 3*c* thereof becomes the lower edge, for example (see FIGS. 5 and 6). FIGS. 5 and 6 are diagrams showing the positional relation among the reflector 20, the board 2, and the semiconductor light emitting element 3. FIG. 5 is a conceptual view showing a state where the vehicle lamp 21 is seen from the front side and FIG. 6 is a conceptual view showing a state where the lamp is seen from an arrow direction in FIG. 5.

In the vehicle lamp 21 configured in the manner described above, when the semiconductor light emitting element 3 is lighted, light emitted from the light emitting element is reflected by the reflector 20 and irradiated in the forward direction, for example, via the projection lens.

Figure 7:
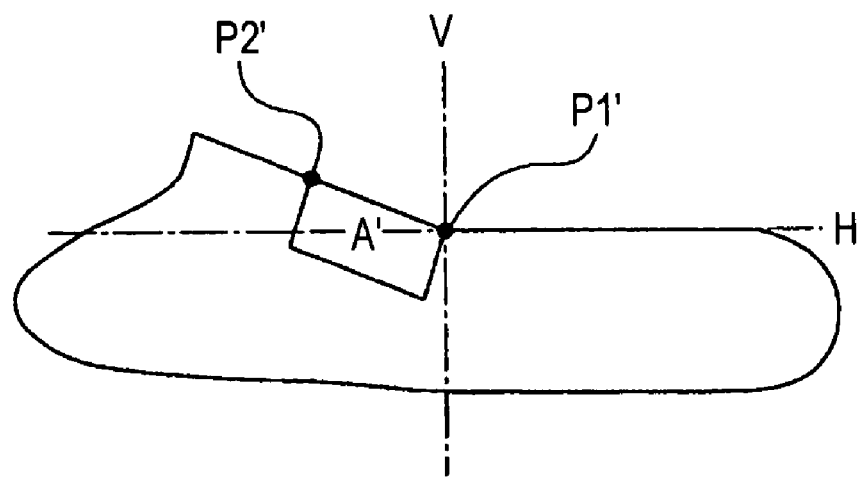
FIG. 7 is a diagram showing a light distribution pattern according to the vehicle lamp shown in FIGS. 5 and 6.

FIG. 7 is a diagram showing a light distribution pattern when light is irradiated from the vehicle lamp 21. Light reflected by a portion A in FIG. 5 is projected as A' in the light distribution pattern. Light emitted from P1-P2 (the end edge 3*c*) is projected as P1'-P2' in the light distribution pattern to form a cutoff line.

Light emitted from the semiconductor light emitting element 3 may be reflected by the plane-shaped electrode portions 6, 6 and the light thus reflected may be irradiated in the forward direction via the reflector 20 and the projection lens. However, as described above, because the plane-shaped electrode portions 6, 6 do not protrude on the direction Y1 side than the semiconductor light emitting element 3 in the light emitting module 1, the light reflected by the plane-shaped electrode portions 6, 6 is not projected above the light distribution pattern.

Figure 8:
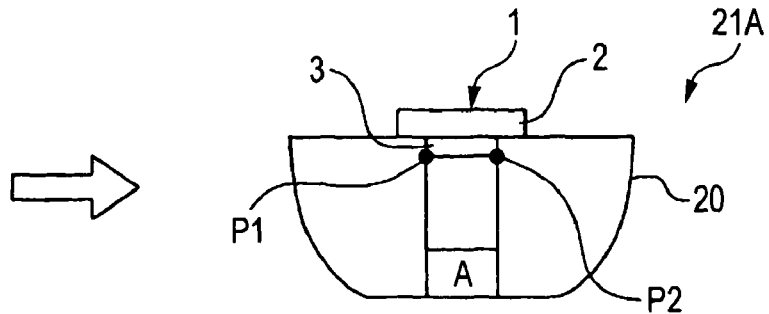
FIG. 8 is a conceptual view of another vehicle lamp which is seen from a front side, and shows a positional relation between a reflector, a board, and the semiconductor light emitting element.
Figure 9:
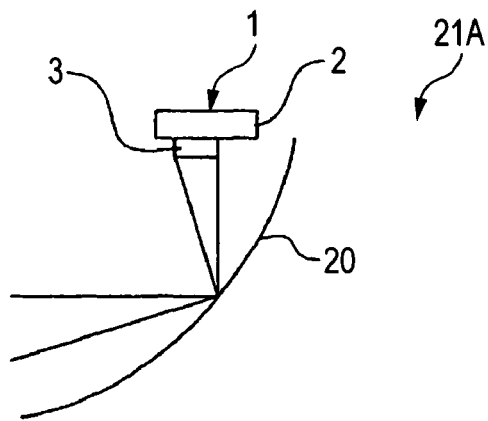
FIG. 9 is a conceptual view of the vehicle lamp seen from an arrow direction in FIG. 8.
Figure 10:
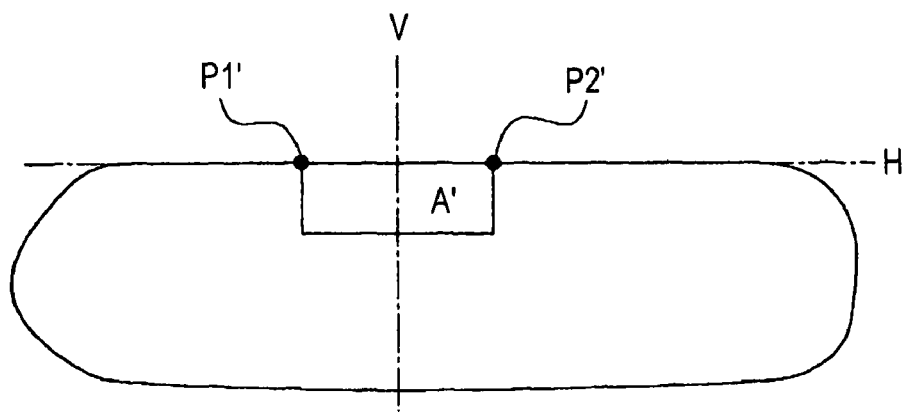
FIG. 10 is a diagram showing a light distribution pattern according to the vehicle lamp shown in FIGS. 8 and 9.

Further, as shown in FIGS. 8 and 9, a vehicle lamp 21A may be configured such that the radiation body 11 is attached to the optical component in a state that the board 2 faces the up-and-down directions. In this case, the end edge 3*c* of the semiconductor light emitting element 3 is directed as the front edge. FIGS. 8 to 10 correspond to FIGS. 5 to 7. That is, FIG. 8 is a conceptual view showing a state where the vehicle lamp 21A is seen from the front side, FIG. 9 is a conceptual view showing a state where the lamp is seen from an arrow direction in FIG. 8 and FIG. 10 is a diagram showing the light distribution pattern.

Also in the vehicle lamp 21A configured in the manner described above, because the plane-shaped electrode portions 6, 6 do not protrude on the direction Y1 side than the semiconductor light emitting element 3, the light reflected by the plane-shaped electrode portions 6, 6 is not projected above the light distribution pattern.

As described above, in the vehicle lamp 21A, because the plane-shaped electrode portions 6, 6 do not protrude on the direction Y1 side than the semiconductor light emitting element 3, the light reflected by the plane-shaped electrode portions 6, 6 is not projected in an area where the light distribution pattern is not projected and so the generation of a glare light can be prevented.

Further, in each of the vehicle lamps 21, 21A, because each of the light emitting portion 3A and the board 2 in configured in a rectangular shape and the light emitting portion 3A is disposed on the board 2 so that the longitudinal direction of the light emitting portion 3A coincides with the longitudinal direction of the board 2, the design of the light distribution pattern can be facilitated.

Further, because a pair of the plane-shaped electrode portions 6, 6 are formed along an outer circumference of the board 2, the plane-shaped electrode portions 6, 6 are positioned so as to be separate from the semiconductor light emitting element 3 such that a short-circuit can be prevented from occurring.

Furthermore, in each of the vehicle lamps 21, 21A, because the feeding terminals 10,10 of the feeding attachment 5 are coupled to the plane-shaped electrode portions 6, 6 by the welding, it is not necessary to use a dedicated fixing member in order to affix the feeding attachment 5 and the board 2. Thus, the number of components can be reduced.

The light emitting portion 3A may have only one semiconductor light emitting element 3. Alternatively, like a light emitting portion 3B shown in FIG. 11, the light emitting portion may have a plurality of semiconductor light emitting elements 3, which are arranged in a manner that the semiconductor light emitting elements 3, each formed in a square shape, are disposed in a line to form a rectangular shape as a whole.

Figure 11:
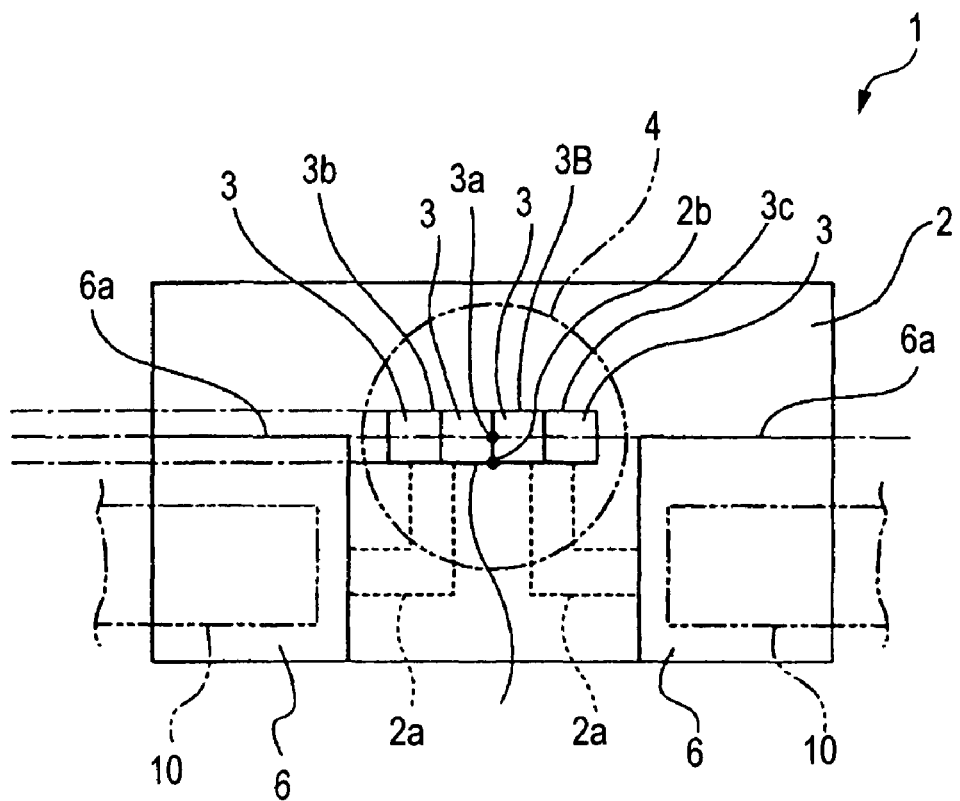
FIG. 11 is an enlarged plan view showing a light emitting module having a light emitting portion which includes a plurality of semiconductor light emitting elements.
Figure 11:
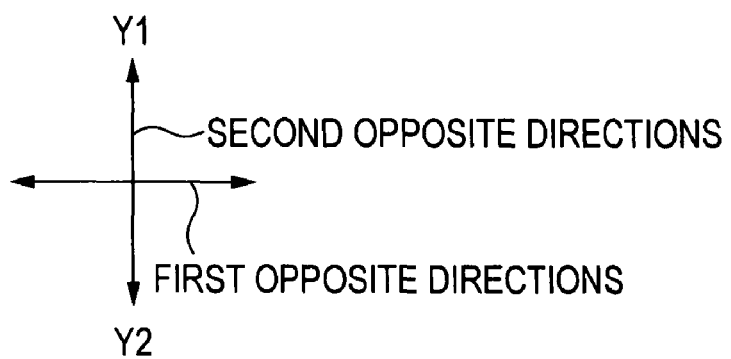

Further, as described above, the end faces 6a, 6a in the direction Y1 of the plane-shaped electrode portions 6, 6 are merely required not to protrude on the Y1 side than the end face 3b in the direction Y1 of the semiconductor light emitting element 3. Thus, as shown in FIG. 11, the end faces 6a, 6a of the plane-shaped electrode portions 6, 6 can be located between the end face 3b in the direction Y1 of the semiconductor light emitting element 3 and the end face 3d in the direction Y2.

While description has been made in connection with embodiments of the present invention, it will be obvious to those skilled in the art that various changes and modification may be made therein without departing from the present invention. It is aimed, therefore, to cover in the appended claims all such changes and modifications falling within the true spirit and scope of the present invention.

What is claimed is:

1. A light emitting module for a vehicle lamp, comprising:
    a board formed in a rectangular shape;
    a conductive pattern formed on the board;
    a light emitting portion disposed on the board, the light emitting portion comprising a semiconductor light emitting element; and
    a pair of plane-shaped electrode portions formed on the board and coupled to the semiconductor light emitting element via the conductive pattern, wherein
        when directions along which one pair of opposite sides of the board extend are defined as first opposite directions, and directions along which the other pair of opposite sides of the board extend are defined as second opposite directions, both the first opposite directions and the second opposite directions are orthogonal to a thickness direction of the board, the pair of plane-shaped electrode portions are located so as to be separated in the first opposite directions,
        a center of the semiconductor light emitting element is located at a position shifted from a center of the board in one of the second opposite directions,
        the pair of plane-shaped electrode portions comprise first end faces that face the one of the second opposite directions and second end faces that face a direction opposite the one of the second opposite directions,
        the semiconductor light emitting element comprises a first light emitting element end face that faces the one of the second opposite directions and a second light emitting element end face that faces the direction opposite the one of the second opposite directions,
        the first end faces of the pair of plane-shaped electrode portions are arranged so as not to protrude in the one of the second opposite directions from the first light emitting element end face, and
        the second end faces of the pair of plane-shaped electrode portions are positioned farther in the direction opposite the one of the second opposite directions than the second light emitting element end face.

2. The light emitting module according to claim 1, wherein the light emitting portion is formed in a rectangular shape, and the light emitting portion is disposed on the board such that a longitudinal direction of the light emitting portion almost coincides with a longitudinal direction of the board.

3. The light emitting module according to claim 2, wherein the pair of plane-shaped electrode portions are formed along an outer circumference of the board.

4. The light emitting module according to claim 3, further comprising a feeding attachment that includes a base plane portion formed of resin material, and feeding terminals protruding from the base plane portion, wherein the feeding terminals are coupled to the plane-shaped electrode portions by welding.

5. The light emitting module according to claim 2, further comprising a feeding attachment that includes a base plane portion formed of resin material, and feeding terminals protruding from the base plane portion, wherein the feeding terminals are coupled to the plane-shaped electrode portions by welding.

6. The light emitting module according to claim 1, wherein the pair of plane-shaped electrode portions are formed along an outer circumference of the board.

7. The light emitting module according to claim 6, further comprising a feeding attachment that includes a base plane portion formed of resin material, and feeding terminals protruding from the base plane portion, wherein the feeding terminals are coupled to the plane-shaped electrode portions by welding.

8. The light emitting module according to claim 1, further comprising a feeding attachment that includes a base plane portion formed of resin material, and feeding terminals protruding from the base plane portion, wherein the feeding terminals are coupled to the plane-shaped electrode portions by welding.

9. The light emitting module according to claim 1, wherein the plane-shaped electrode portions are located at respective end portions of the board in the first opposite directions.

10. The light emitting module according to claim 1, wherein the plane-shaped electrode portions are both located at one end portion of the board in the second opposite directions.

11. A vehicle lamp comprising:
a light emitting module; and
a reflector that reflects light emitted from the light emitting module in a forward direction for irradiation as irradiation light, wherein
the light emitting module comprises:
a board formed in a rectangular shape;
a conductive pattern formed on the board;
a light emitting portion disposed on the board, the light emitting portion comprising a semiconductor light emitting element; and
a pair of plane-shaped electrode portions formed on the board and coupled to the semiconductor light emitting element via the conductive pattern, wherein
when directions along which one pair of opposite sides of the board extend are defined as first opposite directions, and directions along which the other pair of opposite sides of the board extend are defined as second opposite directions, both the first opposite directions and the second opposite directions are orthogonal to a thickness direction of the board,
the pair of plane-shaped electrode portions are located so as to be separated in the first opposite directions,
a center of the semiconductor light emitting element is located at a position shifted from a center of the board in one of the second opposite directions,
the pair of plane-shaped electrode portions comprise first end faces that face the one of the second opposite directions and second end faces that face a direction opposite the one of the second opposite directions,
the semiconductor light emitting element comprises a first light emitting element end face that faces the one of the second opposite directions and a second light emitting element end face that faces the direction opposite the one of the second opposite directions,
the first end faces of the pair of plane-shaped electrode portions are arranged so as not to protrude in the one of the second opposite directions from the first light emitting element end face, and
the second end faces of the pair of plane-shaped electrode portions are positioned farther in the direction opposite the one of the second opposite directions than the second light emitting element end face.

12. The vehicle lamp according to claim 11, wherein the light emitted from an edge of the end face of the semiconductor light emitting element on the side facing toward the one of the second opposite directions forms at least a part of a cutoff line of an irradiation pattern of the irradiation light.

13. The vehicle lamp according to claim 11, wherein the light emitting portion is formed in a rectangular shape, and the light emitting portion is disposed on the board such that a longitudinal direction of the light emitting portion almost coincides with a longitudinal direction of the board.

14. The vehicle lamp according to claim 11, wherein the pair of plane-shaped electrode portions are formed along an outer circumference of the board.

15. The vehicle lamp according to claim 11, further comprising a feeding attachment that includes a base plane portion formed of resin material, and feeding terminals protruding from the base plane portion, wherein the feeding terminals are coupled to the plane-shaped electrode portions by welding.

16. The vehicle lamp according to claim 11, further comprising a radiation body attached the light emitting module, the radiation body comprising a base portion and radiation fins protruded backward from the base portion.

17. The vehicle lamp according to claim 16, wherein the respective portions of the radiation body are integrally formed by a material with high heat transfer properties.

18. The light emitting module according to claim 11, wherein the plane-shaped electrode portions are located at respective end portions of the board in the first opposite directions.

19. The light emitting module according to claim 11, wherein the plane-shaped electrode portions are both located at one end portion of the board in the second opposite directions.

* * * * *